United States Patent [19]

Futami et al.

[11] Patent Number: 4,498,152
[45] Date of Patent: Feb. 5, 1985

[54] CASSETTE TYPE MAGNETIC BUBBLE MEMORY DEVICE

[75] Inventors: Toshio Futami; Shoji Yoshimoto; Ryuji Yano, all of Mobara, Japan

[73] Assignee: Hitachi, Ltd., Tokyo, Japan

[21] Appl. No.: 482,154

[22] Filed: Apr. 5, 1983

[30] Foreign Application Priority Data

Apr. 9, 1982 [JP] Japan ................................ 57-58135

[51] Int. Cl.³ .............................................. G11C 19/08
[52] U.S. Cl. ......................................................... 365/1
[58] Field of Search ........................................ 365/1, 2

[56] References Cited

FOREIGN PATENT DOCUMENTS 42735 12/1981 European Pat. Off. ............... 365/2
43427  4/1979 Japan ...................................... 365/2

OTHER PUBLICATIONS

Journal of Magnetism & Magnetic Materials 15–18, Jan.–Mar. 1980; pp. 1495–1496.

Primary Examiner—James W. Moffitt
Attorney, Agent, or Firm—Charles E. Pfund

[57] ABSTRACT

In a cassette type magnetic bubble memory device comprising: a magnetic bubble memory device mounted to a base plate and having a magnetic bubble memory element, a pair of coils for generation of a rotating field for driving the element, and a pair of permanent magnet plates and yoke plates for applying a bias field to the element; and an electric signal connector section provided on one end of the base plate and adapted to be connected to a loader, an electrically conductive metal frame is provided which surrounds at least the connector section, and a resin sealing medium is provided which seals at least the magnetic bubble memory device continuously to the inner walls of said frame.

7 Claims, 8 Drawing Figures

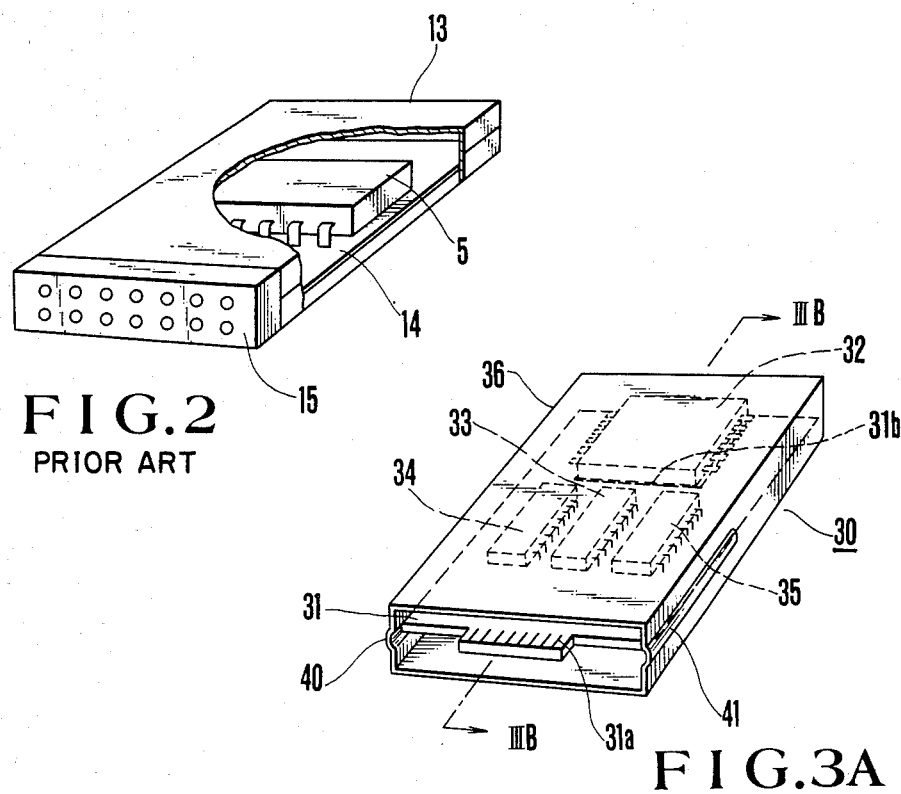
FIG. 2 PRIOR ART
FIG. 3A
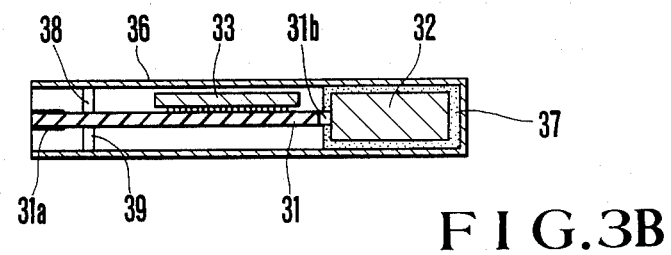
FIG. 3B
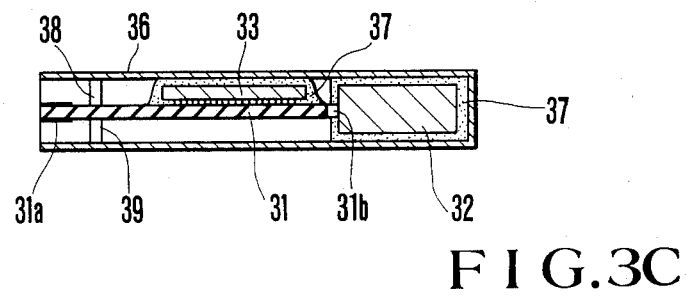
FIG. 3C

CASSETTE TYPE MAGNETIC BUBBLE MEMORY DEVICE

BACKGROUND OF THE INVENTION

This invention generally relates to a magnetic bubble memory device and, more particularly, to a portable cassette type magnetic bubble memory device which can be smoothly loaded and unloaded.

A typical magnetic bubble memory apparatus has a construction as shown in the block diagram of FIG. 1, comprising a peripheral circuit section 9 and a central processing unit (CPU) 12 connected thereto, wherein the circuit section 9 includes an interface control circuit 1, a magnetic bubble memory device control circuit 2, a timing control circuit 3, a magnetic bubble memory device drive circuit 4, a magnetic bubble memory device 5, a signal detection circuit 6, a rotating magnetic field drive circuit 7 and a pulse current drive circuit 8, and the central processing unit (CPU) 12 includes a microprocessor 10 and a random access memory (RAM) 11. The magnetic bubble memory device 5 has, as well known in the art, a magnetic bubble memory element, a pair of permanent magnet plates for generation of a bias field, yokes therefor and a pair of coils for generation of a rotating field, and its data write and read operations are controlled by commands from the CPU 12.

With the recent spread of the magnetic bubble memory apparatus noted above, there is an increasing need for a cassette type magnetic bubble memory device which is advantageous from the standpoint of cost reduction, portability and ease of operation. In a cassette type magnetic bubble memory device, a cassette including the magnetic bubble memory device 5 is inserted into a loader including circuit components of section 9 except for the magnetic bubble memory device 5.

As the above cassette type magnetic bubble memory device, there has been proposed one as shown in FIG. 2. This construction comprises a case 13, for instance made of synthetic resin, accommodating a magnetic bubble memory device 5 mounted on a base plate 14, the case having an end provided with a connector 15 for connection to a loader.

The cassette type magnetic bubble memory device having the above construction, however, has the following drawback. Since the outer frame of the cassette type magnetic bubble memory device shown in FIG. 2 is constituted by the synthetic resin case 13, its mechanical strength against shocks is low. In addition, since a large space filled with air is present in the case 13, the thermal resistance from a heat-generating element in the cassette to air outside the case 13 is high and, therefore, the heat radiation property is poor. The operating characteristics of the cassette type magnetic bubble memory device thus are greatly deteriorated when the cassette is in a high-temperature atmosphere. Further, the size of the connector 15 is so large that the thickness of the cassette amounts to about 20 mm. Therefore, the cassette has difficulties with portability and cost reduction. Moreover, since the electric signal pins of the connector 15 are embedded in an insulator of synthetic resin, the electric circuit inside the cassette is liable to be destroyed by discharge of electrostatic charge only through the pins.

SUMMARY OF THE INVENTION

The invention is intended in the light of the problems discussed above inherent in the prior art, and its object is to provide a cassette type magnetic bubble memory device, which can be small in size to assure high portability, and which can have high mechanical shock resistant and heat radiation properties.

According to the present invention, there is provided a cassette type magnetic bubble memory device comprising: a magnetic bubble memory device mounted to a base plate and having a magnetic bubble memory element, a pair of coils for generation of a rotating field for driving the element, and a pair of permanent magnet plates and yoke plates for applying a bias field to the element; and an electric signal connector section provided on one end of the base plate and adapted to be connected to a loader, characterized in that an electrically conductive metal frame is provided which surrounds at least the connector section, and a resin sealing medium is provided which seals at least the magnetic bubble memory device.

BRIEF DESCRIPTION OF THE DRAWINGS

FIG. 2 is a partly broken-away perspective view showing a prior art cassette type magnetic bubble memory device;

FIG. 3A is a perspective view showing one embodiment of a cassette type magnetic bubble memory device according to the invention;

FIG. 3B is a sectional view taken on line IIIB—IIIB in FIG. 3A;

FIG. 3C is a sectional view showing a modified embodiment of the invention;

FIG. 4B is a sectional view taken on line IVB—IVB in FIG. 4A; an

DESCRIPTION OF PREFERRED EMBODIMENTS

Figure 1:
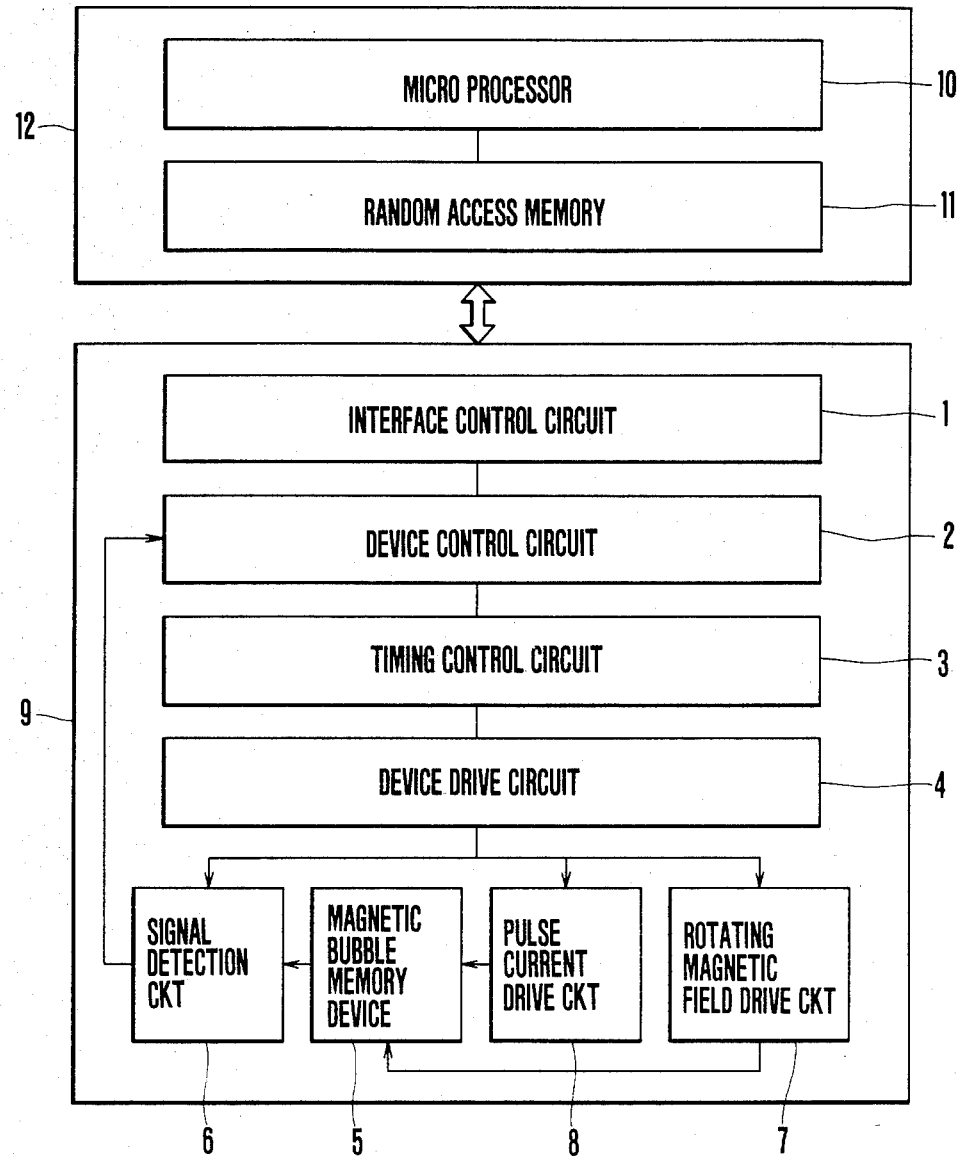
FIG. 1 is a block diagram showing the essential part of an example of a magnetic bubble memory apparatus.

Referring now to FIGS. 3A and 3B, there is shown a preferred embodiment of a cassette type magnetic bubble memory device according to the present invention. The cassette type magnetic bubble memory device, generally designated by reference numeral 30, comprises a base plate 31 in the form of a printed circuit board having a gold-plated edge connector section 31a or a molded connector. A magnetic bubble memory device 32, a circuit element 33 of the signal detection circuit 6, a diode module 34 and a CR module 35 are mounted to the printed circuit board 31. The magnetic bubble memory device 32, which has a large height, penetrates an opening 31b formed in the printed circuit board 31. An electrically conductive metal frame 36 of aluminum, for example, which is required to project to surround at least the connector section 31a takes the form of a casing, in this embodiment, which accommodates all the components described above. As will be seen from FIG. 3B, the magnetic bubble memory device 32 is sealed with a sealing medium 37 which fills a gap between the device 32 and the casing 36 so as to be wrapped thereby. The sealing medium 37 is epoxy or silicon resin and is effective not only to robustly support the device 32 to thereby make the same immune to mechanical vibrations or shocks but also to provide a plenum which is more efficient conductor of heat generated in the device 32 than air.

Upper and lower spacers 38 and 39 are adapted to support the base plate 31 at one end portion thereof. The opposite sides of the casing 36 are partly raised outwardly to form a longitudinally elongated guide channels 40 and 41 in which side edges of the base plate 31 are fitted and supported. A connector section of a loader to be described later has guide channels complement to the guide channels 40 and 41.

In a modified embodiment as shown in FIG. 3C, the circuit element 33, diode module 34 and CR module 35 are also sealed with sealing medium 37 for promoting mechanical support for these components and conduction of heat generated therein.

Figure 4A:
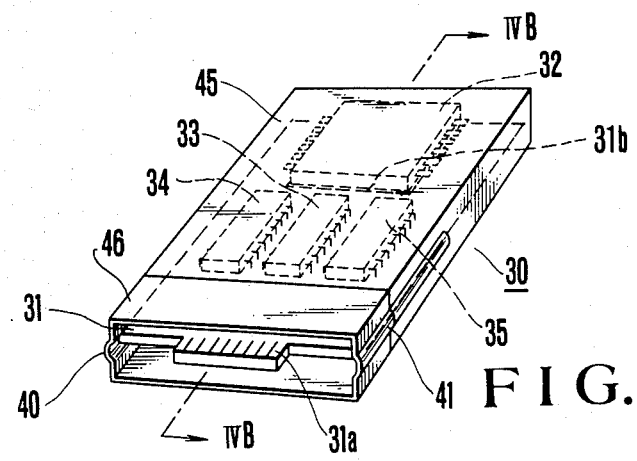
FIG. 4A is a perspective view showing another embodiment of the cassette type magnetic bubble memory device according to the invention.
Figure 4B:
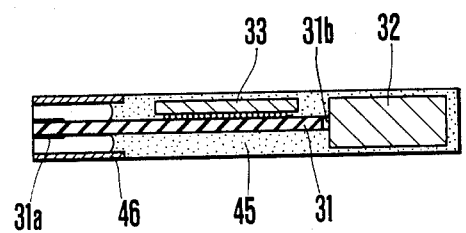

Turning to FIGS. 4A and 4B, there is shown another embodiment of the cassette type magnetic bubble memory device 30 according to this invention in which the same components as those in FIGS. 3A to 3C are designated by the same reference numerals. In this embodiment, the base plate 31, magnetic bubble memory device 32, circuit element 33, diode module 34 and CR module 35 are sealed by molding epoxy or silicone resin 45, with only one end portion of the base plate 31 left to expose. The connector section 31a is formed on the exposed one end portion. An electrically conductive metal frame 46 of aluminum, for example, takes the form of a belt ring in this embodiment which surrounds the connector section 31a.

Figure 5:
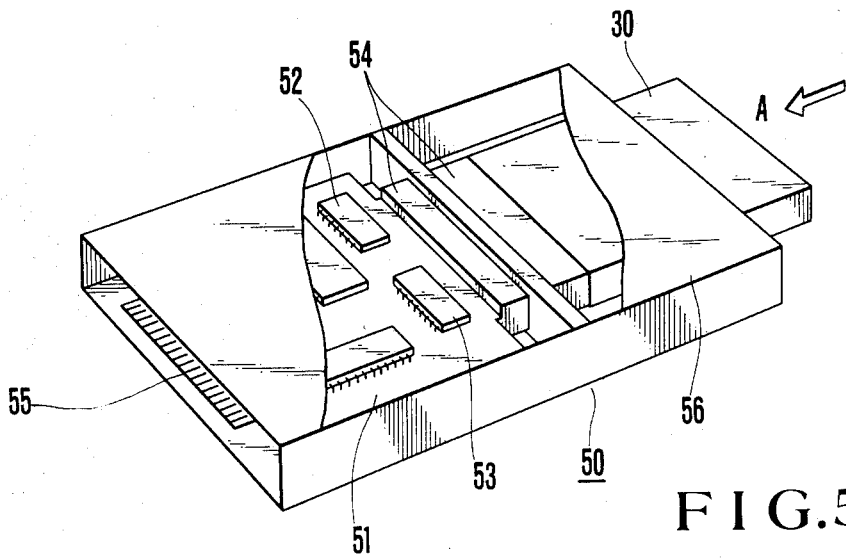
FIG. 5 is a partly broken-away perspective view wherein the cassette type magnetic bubble memory device according to the invention is loaded to a loader.

As shown in FIG. 5, the cassette type magnetic bubble memory device described above is loaded to a loader 50. The loader 50 comprises a base plate 51, on which elements 52 and 53 of the peripheral circuit section 9 such as the rotating field drive circuit 7 and pulse current drive circuit 8 for driving the magnetic bubble memory device 5 (see FIG. 1) are mounted. A connector, for example, a zero-insertion-force connector 54 is mounted on one edge of the base plate 51. A connector section 55 for connection to the CPU 12 (see FIG. 1) is mounted on the other edge of the base plate 51. The individual components noted above are accommodated in a holder 56. The cassette type magnetic bubble memory 30 described above is inserted into the loader 50 in the direction of arrow A to electrically connect the edge connector section 31a to the zero-insertion-force connector 54. In this state, data can be read out. Since various cassette type bubble memory devices having different data quantities can be selectively loaded, it is possible to increase the memory capacity and read out a great variety of data.

With the cassette type magnetic bubble memory device 30 having the above construction, in which at least the magnetic bubble memory device 32 is sealed with resin, heat generated from the device can be conducted to the outside through the resin. Thus, the thermal resistance can be reduced to provide improved heat radiation property and hence improved operating characteristics in the high-temperature atmosphere. Further, the construction has high mechanical strength against external shocks. It is thus robust and can be conveniently carried along and stored. Further, its durability is increased, which leads to cost reduction. Furthermore, since the connector consists of the connector section 31a, which can be formed on one edge of the printed circuit board 31 by forming an array of a number of terminal groups as a conductor pattern and plating these terminal groups with gold, and the electrically conductive frame surrounding the connector section, the destruction of the internal electric circuit due to electrostatic discharge and damage to the connector section due to mechanical shocks, can be eliminated to improve the reliability of transfer of electric signals.

What is claimed is:

1. A cassette type magnetic bubble memory comprising: a magnetic bubble memory device mounted to extend above and below a base plate and having a magnetic bubble memory element, a pair of coils for generation of a rotating field for driving the element, and a pair of permanent magnet plates and yoke plates for applying a bias field to the element; a peripheral circuit for driving the magnetic bubble memory device; and an electric signal connector section provided on one end of the base plate and adapted to be connected to a loader, wherein an electrically conductive metal frame is provided which surrounds at least the connector section, and a resin sealing medium is provided in which at least the magnetic bubble memory device is embedded, said resin sealing medium extending continuously to transmit heat to the peripheral surface of said cassette.

2. A cassette type magnetic bubble memory device according to claim 1 wherein said metal frame is a casing for accomodating said magnetic bubble memory device, said base plate, and said peripheral circuit.

3. A cassette type magnetic bubble memory device according to claim 2 wherein said magnetic bubble memory device and said peripheral circuit are sealed with the resin sealing medium.

4. A cassette type magnetic bubble memory device according to claim 1 wherein said magnetic bubble memory device, said peripheral circuit and said base plate are sealed with a mold of the resin sealing medium, with said connector section exposed, and said metal frame is a belt ring which surrounds said connector section.

5. A cassette type magnetic bubble memory device according to claim 1 wherein said resin sealing medium is epoxy resin.

6. A cassette type magnetic bubble memory device according to claim 1 wherein said resin sealing medium is silicon resin.

7. A cassette type magnetic bubble memory device according to claim 1 or 2 wherein said metal frame is made of aluminum.

* * * * *